(12) United States Patent
Taylor

(10) Patent No.: US 7,425,134 B1
(45) Date of Patent: Sep. 16, 2008

(54) COMPRESSION MAT FOR AN ELECTRICAL CONNECTOR

(75) Inventor: Paul R. Taylor, Mechanicsburg, PA (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 11/751,075

(22) Filed: May 21, 2007

(51) Int. Cl.
 *H01R 12/00* (2006.01)
(52) U.S. Cl. .......................................... 439/66; 439/67
(58) Field of Classification Search .................. 439/66, 439/67, 91, 591
See application file for complete search history.

(56) References Cited

U.S. PATENT DOCUMENTS

| | | | |
|---|---|---|---|
| 4,538,865 A | 9/1985 | Wakabayashi et al. | |
| 4,926,549 A * | 5/1990 | Yoshizawa et al. | 29/876 |
| 5,059,129 A | 10/1991 | Brodsky et al. | |
| 5,099,393 A | 3/1992 | Bentlage et al. | |
| 5,273,440 A | 12/1993 | Ashman et al. | |
| 5,468,917 A | 11/1995 | Brodsky et al. | |
| 5,703,331 A | 12/1997 | Brodsky et al. | |
| 5,819,406 A * | 10/1998 | Yoshizawa et al. | 29/877 |
| 5,873,740 A | 2/1999 | Alcoe et al. | |
| 5,899,757 A | 5/1999 | Neidich et al. | |
| 5,932,047 A | 8/1999 | Brodsky et al. | |
| 5,947,750 A | 9/1999 | Alcoe et al. | |
| 6,036,502 A | 3/2000 | Neidich et al. | |
| 6,196,852 B1 * | 3/2001 | Neumann et al. | 439/66 |
| 6,302,705 B1 | 10/2001 | Yatskov et al. | |
| 6,336,816 B1 | 1/2002 | Yatskov et al. | |
| 6,368,117 B1 | 4/2002 | Taylor | |
| 6,386,890 B1 * | 5/2002 | Bhatt et al. | 439/67 |
| 6,456,100 B1 | 9/2002 | Hembree et al. | |
| 6,491,543 B1 * | 12/2002 | Yatskov | 439/493 |
| 6,500,010 B2 * | 12/2002 | Yatskov | 439/67 |
| 6,514,088 B1 | 2/2003 | Yatskov et al. | |
| 6,537,082 B2 | 3/2003 | Hopfer, III et al. | |
| 6,537,083 B1 | 3/2003 | Yatskov et al. | |
| 6,703,640 B1 | 3/2004 | Hembree et al. | |
| 6,782,613 B1 * | 8/2004 | Wark et al. | 29/842 |
| 6,939,145 B2 | 9/2005 | Hembree et al. | |
| 7,011,532 B2 | 3/2006 | Hembree et al. | |
| 7,063,561 B2 * | 6/2006 | Pabst | 439/498 |
| 2007/0105406 A1 * | 5/2007 | Li | 439/66 |
| 2007/0298624 A1 * | 12/2007 | Hougham et al. | 439/66 |

* cited by examiner

*Primary Examiner*—Chandrika Prasad
(74) *Attorney, Agent, or Firm*—Hooker & Habib, P.C.

(57) ABSTRACT

An electrical connector assembly includes a flexible circuit attached to a clamp member and a compression mat between the clamp member and the flexible circuit. The compression mat has a number of spaced-apart pillars that overlay contacts of the flexible circuit. The pillars are interconnected by sets of upper and lower bridges, with each set of bridges interconnecting some, but not all, the pillars. Each pillar has a rectangular cross section with concave sides.

21 Claims, 5 Drawing Sheets

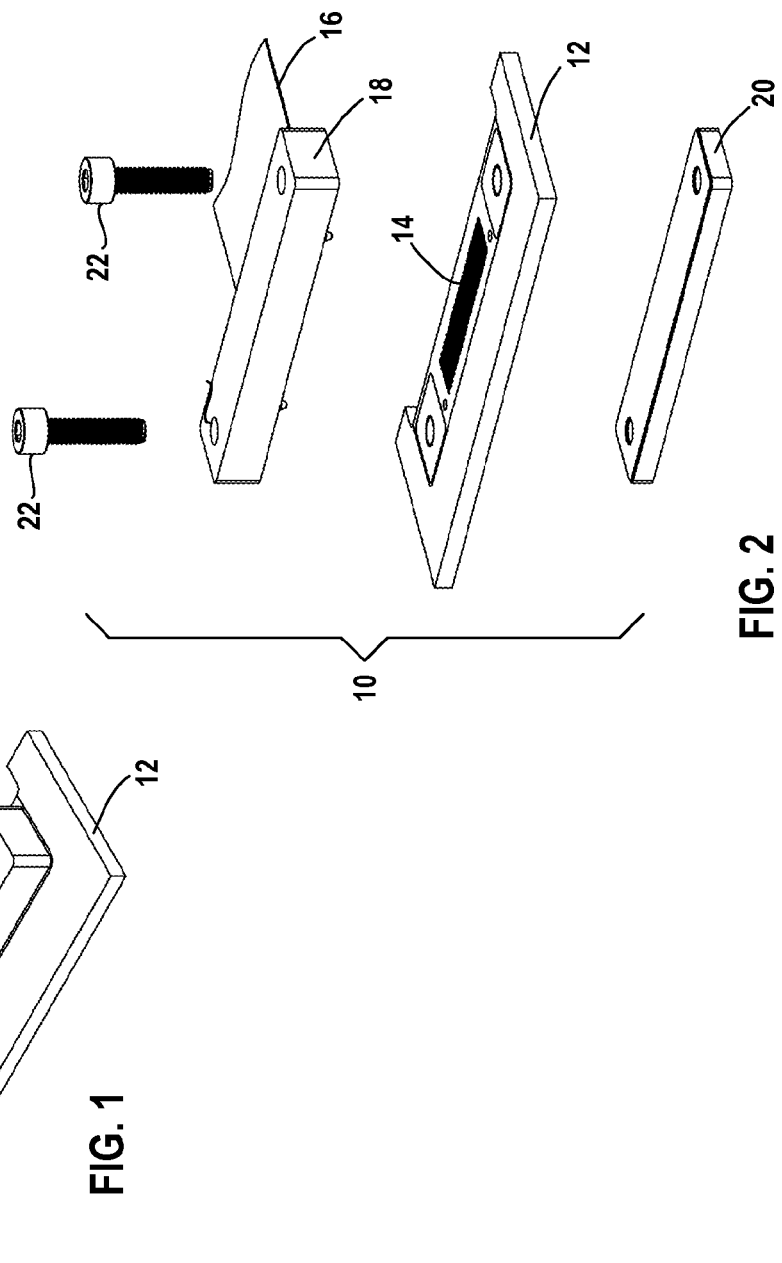

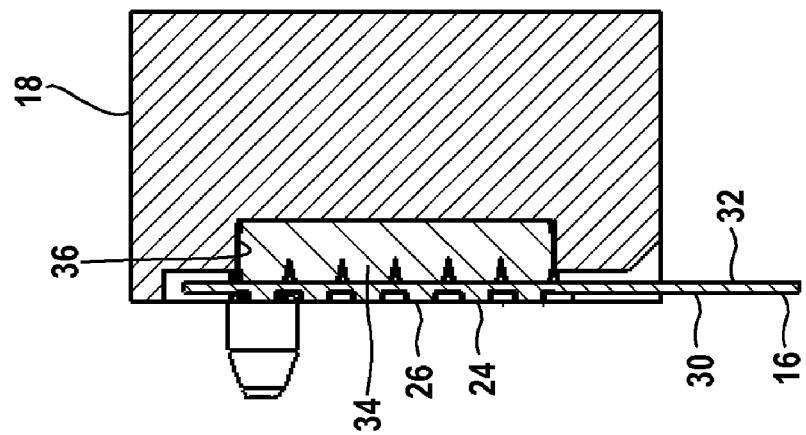
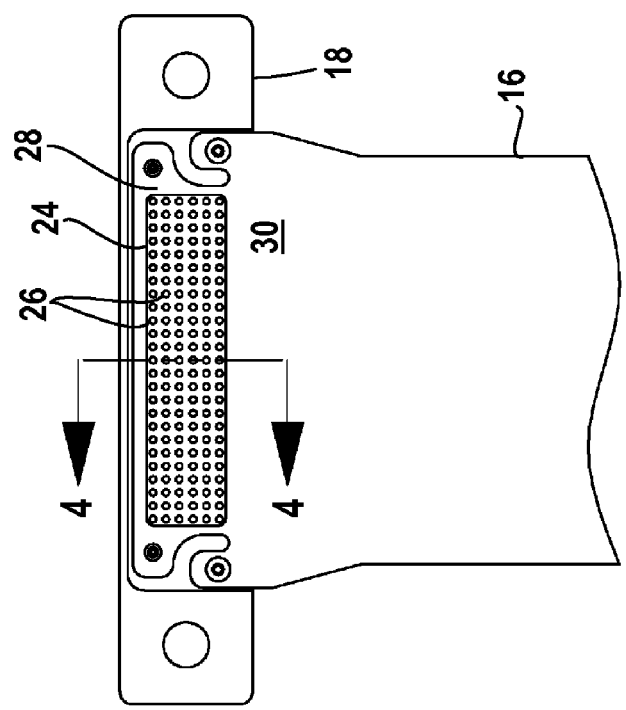

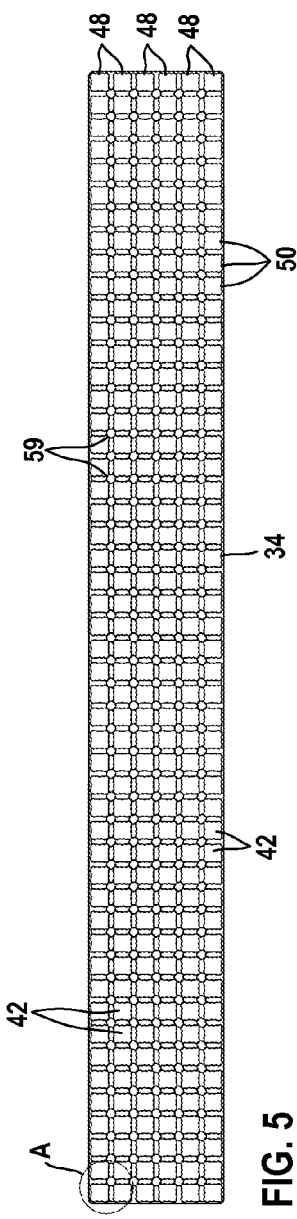
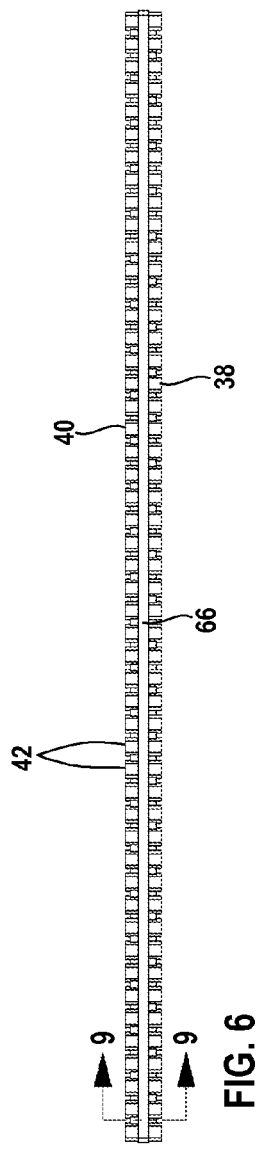
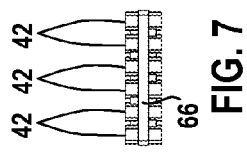
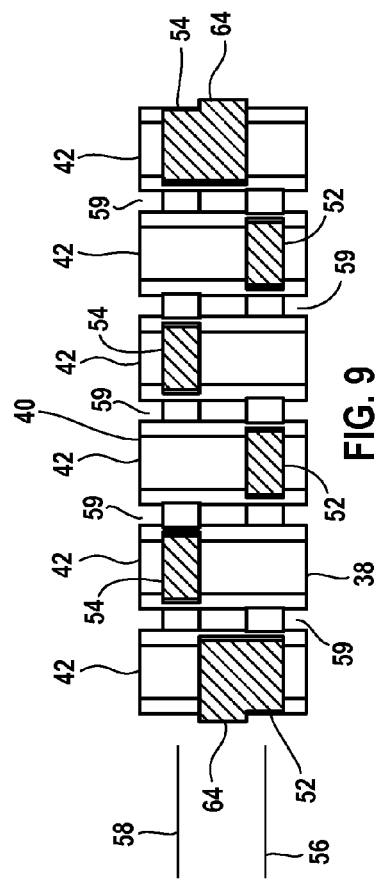
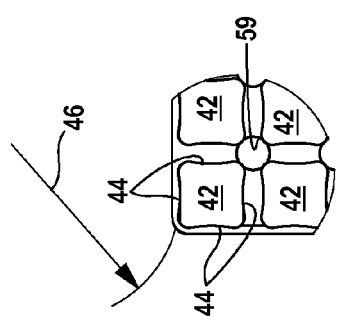

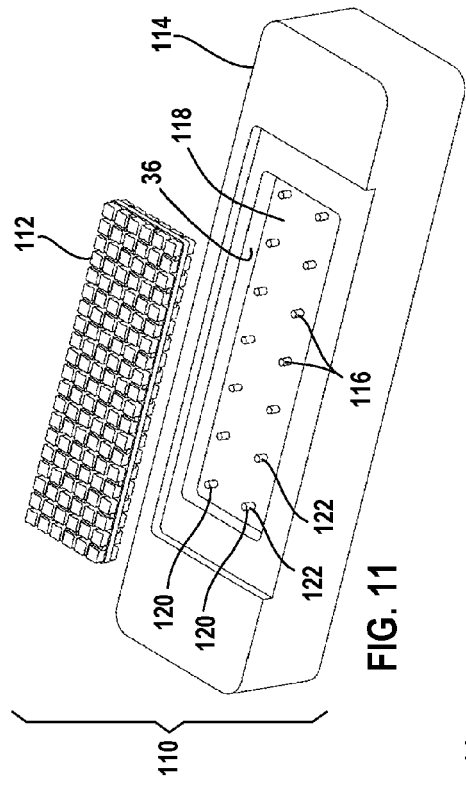
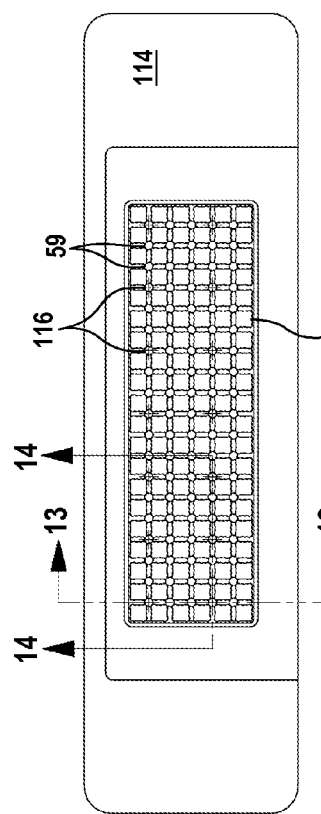
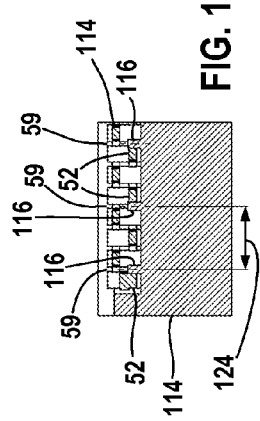
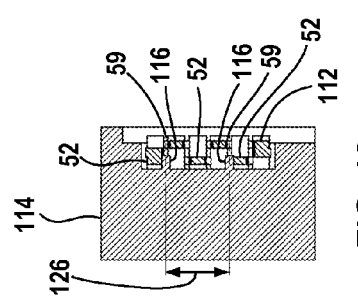
FIG. 11
FIG. 12
FIG. 13
FIG. 14

COMPRESSION MAT FOR AN ELECTRICAL CONNECTOR

FIELD OF THE INVENTION

The invention relates to an electrical connector having a flexible circuit for forming electrical connections between closely spaced contacts of the flexible circuit and closely spaced contacts of a circuit board, and particularly to a compression mat or pressure pad for the electrical connector.

BACKGROUND OF THE INVENTION

Electrical connectors are used to form electrical connections between circuit boards that each contains a high density of electrical contacts. The contacts are arranged in a series of rows and columns in a contact field on one side of the circuit board. The contacts are closely spaced and a large number of contacts are included in a relatively small area.

One type of high-density electrical connector includes a flexible circuit having a contact field located on one side of the flexible circuit. The contact field includes contacts for electrically interconnecting the flexible circuit with another contact field. The flexible circuit is mounted on a backing member or clamp member on the opposite side of the flexible circuit across from the contacts. The clamp member carries a spring that faces the flexible circuit.

The clamp member is held against the circuit board with the contacts of the flexible circuit overlaying corresponding contacts of the circuit board. The spring is compressed between the support member and the circuit board, the spring generating a spring force pressing the contacts of the flexible circuit against the contacts of the circuit board.

The spring is formed as a compression mat or pressure pad made from an elastomeric material. Conventional compression mats have a number of holes or voids that extend at least partially through the mat and define a number of pillars or fingers spaced apart by the holes or voids. The pillars are arranged to overlay the contacts of the flexible circuit. Compressing the mat compresses the pillars, each pillar pressing a contact of the flexible circuit against the corresponding contact of the circuit board to electrically connect the two contacts.

The pillars are interconnected by elastomeric material adjacent to the side of the mat away from the flexible circuit. As the spring is compressed, the interconnecting material is also compressed and attempts to bulge or grow outwardly in a single common plane. Outward growth of the interconnecting material is resisted by the pillars on the outer perimeter of the compression mat, causing some or all of the outer pillars to buckle. The buckled pillars apply insufficient spring force to the contacts, and poor or no electrical connections are made between the contacts.

Increasing the strength of the pillars to resist buckling is ineffective. The size of the holes between pillars can be reduced to more closely space the pillars and increase the cross sectional area of each pillar. However, the pillars also bulge outwardly as the spring is compressed. If the pillars are too closely spaced together, the sides of adjacent pillars contact and interfere with each other as the spring is compressed. The interference prevents the pillars from applying sufficient spring force to the contacts, and poor or no electrical connections are made between the contacts.

As the number and density of electrical contacts increases, the size and spacing of the pillars decreases. This makes it more difficult to design a compression mat that can reliably apply a spring force to a large number of contacts without the pillars buckling or without the pillars interfering with one another. Thus there is a need for an improved electrical connector having a compression mat that can reliably apply a spring force to a large number of closely spaced electrical contacts while minimizing the tendency of the pillars to buckle or interfere with each another.

SUMMARY OF THE INVENTION

The invention is an improved electrical connector having a compression mat that reliably applies a spring force to a large number of closely spaced electrical contacts. The compression mat minimizes the tendency of the pillars to buckle and interfere with each other when the spring is compressed.

An electrical connector in accordance with the present invention includes a substrate, a compression mat or pressure pad, and a clamp. The substrate has a contact field on one side of the substrate, and the compression mat is on the other side of the substrate. The clamp compresses the compression mat against the substrate to form electrical connections.

The compression mat includes a number of pillars that are spaced apart from one another. Adjacent pillars are interconnected by a set of lower bridges and a set of upper bridges. The sets of upper and lower bridges are spaced apart from each other, with the lower bridges adjacent one side of the mat and the upper bridges adjacent the other side of the mat. Each pair of adjacent pillars is interconnected by a single bridge, which is either an upper bridge or a lower bridge. Each set of bridges interconnects some, but not all, the pairs of pillars.

When the compression mat is compressed, the pillars compress and the sets of upper and lower bridges also compress and bulge outwardly. The outward growth of the interconnecting material is now distributed in two planes instead of a single plane, and so the overall outward growth of the entire mat is reduced. Each set of bridges bulge outwardly less than a conventional compression mat that has interconnecting material in a single, common plane. Consequently the outer pillars resist less outward growth of the bridges, and the buckling forces exerted on the outer pillars are reduced.

In preferred embodiments of the invention the pillars are arranged in rows and columns. The upper and lower bridges alternate along each row and column of pillars. The upper bridges are spaced from another and the lower bridges are spaced from one another along the rows and columns. Outward growth of an upper bridge or lower bridge pushes the pillar attached to the bridge. The growth is not transferred to an adjacent pillar because there is no bridge in the same plane to transfer the growth to the adjacent pillar—the pillar merely bends into the gap between itself and the adjacent pillar. Separating the two planes of interconnecting material into alternating planes of interconnecting material further controls the growth in each plane and reduces the buckling forces exerted on the outer pillars.

In other preferred embodiments of the invention, additional bridges interconnect the pillars on the outer perimeter of the compression mat. The additional bridges form a reinforcement ring or strengthening ring around the outer perimeter of the compression mat. Being limited to the outer perimeter, the additional bridges apply little or no buckling loads to the outer pillars when the compression mat is compressed.

In yet other preferred embodiments of the invention each pillar has a generally rectangular cross section or profile to maximize the volume of the pillar available to generate the spring force. The sides of the pillar are concave when unstressed.

As the compression mat compresses, each pillar bulges outwardly. The concave sides of the pillar lose concavity as the pillar as the pillar is compressed. The sides of the pillar must lose concavity and become convex before the sides of the pillar can engage an adjacent pillar. The concave sides of the pillar delay the onset of convex pillar sides and allow more compression before adjacent pillars contact and interfere with one another. The concave sides also provide additional spaces for the bridges to bulge before interfering with the pillars.

An electrical connector in accordance with the present invention has a number of advantages. The spaced apart sets of interconnecting bridges reduce the outward bulge of the interconnecting material, reducing the buckling forces acting on the outer pillars for the same amount of compression. The compression mat can also be compressed more without buckling the pillars. The lower bridges and pillars can cooperate with alignment posts extending from the clamp to accurately position the compression mat over the contact field.

The square pillar profiles enable a greater spring force to be generated with the same spring compression. The concave pillar sides enable the pillars to be more closely spaced or the spring to be compressed further without adjoining pillars contacting and interfering with each other or interfering with the pillars.

Other objects and features of the invention will become apparent as the description proceeds, especially when taken in conjunction with the accompanying drawings illustrating two embodiments of the invention.

BRIEF SUMMARY OF THE DRAWINGS

FIG. 1 is a perspective view of a first embodiment electrical connector in accordance with the present invention connected to a printed circuit board;

FIG. 2 is an exploded view of FIG. 1;

FIG. 3 is a bottom view of the flexible circuit and clamp of the electrical connector shown in FIG. 1;

FIG. 4 is a sectional view taken along line 4-4 of FIG. 3;

FIGS. 5, 6 and 7 are top, side, and end views of the compression mat of the electrical connector shown in FIG. 1;

FIG. 8 is an enlarged view of the portion of the compression mat circled as "A" in FIG. 5;

FIG. 9 is a sectional view taken along line 9-9 of FIG. 5;

FIG. 11 is an exploded perspective view of a compression mat and clamp of a second embodiment electrical connector in accordance with the present invention;

FIG. 12 is a bottom view of the compression mat housed in the clamp; and

FIGS. 13 and 14 are sectional views taken along lines 13-13 and lines 14-14 respectively of FIG. 12.

DESCRIPTION OF THE PREFERRED EMBODIMENTS

Figure 10:
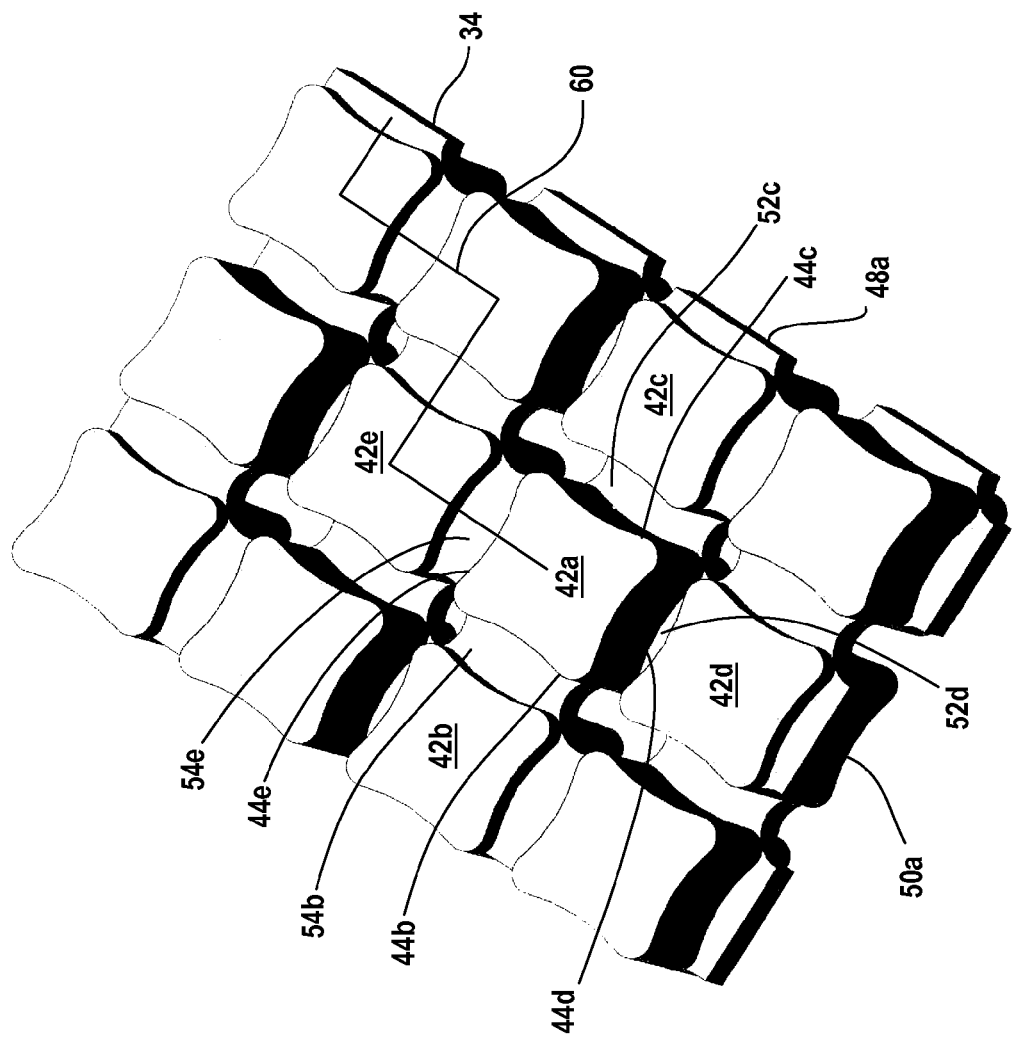
FIG. 10 is an enlarged perspective view of one end of the compression mat.

FIGS. 1 and 2 illustrate a first embodiment electrical connector 10 in accordance with the present invention that forms electrical interconnections with a printed circuit board 12. Circuit board 12 has a contact field 14 on one side of the circuit board that electrically interconnects the circuit board with the electrical connector 10. Contact field 14 has a large number of closely spaced electrical contacts arranged in rows and columns. The illustrated contact field 14 has three hundred contacts arranged in six rows and fifty columns.

Electrical connector 10 includes a flexible circuit 16, a support member or clamp 18 attached to an end of the flexible circuit 16, and a backing member 20. Fasteners 22 extend through holes in the clamp 18 and the circuit board 12, and thread into the backing member 20 to connect the electrical connector 10 to the circuit board 12.

FIGS. 3 and 4 illustrate the flexible circuit 16 and clamp 18. Flexible circuit 16 has a contact field 24 having a number of contacts 26 arranged in rows and columns like the rows and columns of circuit board contact field 14. For clarity, not all three hundred contacts 26 are shown in FIGS. 3 and 4. Electrical contacts 26 engage corresponding electrical contacts of the circuit board contact field 14 to electrically interconnect the flexible circuit 16 with the circuit board 12.

Flexible circuit 16 has an end portion or end substrate 28 attached to clamp 18 and having a first side 30 and an opposite side 32. Contact field 24 and contacts 26 are on the first side 30 of the flexible circuit substrate 28. A spring 34 (shown representationally in FIG. 4) faces the second side 32 of the flexible circuit substrate 28 opposite the contact field 24 and overlays the entire contact field 24. Spring 34 is housed within an open recess or compartment 36 formed in the clamp 18. Unstressed spring 34 extends out of the compartment 36 beyond clamp 18 and towards the flexible circuit 16.

When electrical connector 10 is connected to the circuit board 12, the fasteners 22 press clamp 18 and the spring 34 against one side of the circuit board 12 with the flexible circuit contact field 24 directly over the circuit board contact field 14. Spring 34 is compressed in recess 36 between the clamp 18 and the flexible circuit substrate 28. Flexible circuit substrate 28 is mounted on the clamp 18 for movement with the spring 34 as the spring 34 compresses. Spring 34 generates a spring force that presses the flexible circuit electrical contacts 26 against the circuit board electrical contacts to make electrical interconnections between pairs of contacts.

Flexible circuit substrate 28 preferably includes strain relief features that ensure electrical contacts 26 form reliable electrical connections with the electrical contacts on the circuit board. These features are described in my co-pending U.S. patent application Ser. No. 11/751,070 titled "Flexible Circuit Connector Assembly with Strain Relief", which application is incorporated by reference as if fully set forth herein, and so are not described here.

FIGS. 5-9 illustrate the spring 34. Spring 34 is a compression mat or pressure pad made from an elastomeric material, having a first side 38 to face the flexible circuit substrate 28 and an opposite second side 40. A number of spaced-apart fingers or pillars 42 extend longitudinally from side 38 to side 40. Each pillar 42 has a uniform, substantially rectangular cross section having four longitudinal sides 44. Each side 44 is concave as illustrated by radius of curvature 46 extending into the pillar 42. In other embodiments of the compression mat 34, the pillars 42 could have more or less sides.

Pillars 42 are arranged in rows 48 and columns 50 corresponding to the rows and columns of contact field 24, with each pillar 42 overlaying a corresponding electrical contact 26. In the illustrated embodiment compression mat 34 has three hundred pillars 42 arranged in six rows and fifty columns like the arrangement of electrical contacts 26 in the flexible circuit contact field 24.

Pillars 42 are interconnected to one another by a set of lower bridges 52 and a set of upper bridges 54. The sets of bridges 52, 54 are spaced apart longitudinally from one another. Lower bridges 52 lie in a common plane 56 spaced inwardly from mat side 38 and upper bridges 54 lie in a common plane 58 spaced inwardly from mat side 40. The sets of bridges 52, 54 are spaced apart so that the elastomeric material interconnecting the pillars 42 does not lie in a common plane.

Pillars 42 are interconnected only to adjacent pillars in a row 48 and column 50. Each set of bridges 52, 54 interconnects different pairs of pillars 42, with preferably half the pairs of pillars joined by bridges 52, and the other half of the pairs of pillars joined by bridges 54. Each bridge 52 or 54 is formed as a relatively thin web or planar member that extends from one side of a pillar 42 to the facing side of an adjacent pillar 42. A single bridge interconnects one pair of adjacent pillars 42 in a row or column, which bridge is either a lower bridge 52 or an upper bridge 54.

The lower and upper bridges 52, 54 are preferably arranged to alternate between pillars 42 along each row, and are also arranged to alternate between pillars 42 along each column. In this way one-half of the pairs of pillars 42 in a row 48 or column 50 are joined by lower bridges 52, and the other half of the pairs of pillars 42 in a row 48 or column 50 are joined by upper bridges 54.

The bridges 52, 54 extend only between facing sides of the pillars 42. As a result, the pillars 42 and bridges 52, 54 define regularly spaced rows and columns of uniformly sized passages or through-holes 59 that extend the thickness of the mat 34. Each hole 59 is surrounded by four adjacent pillars 42, as best shown in FIG. 8. The shape or profile of the pillars 42 and bridges 52, 54 define the shapes of the holes 59. In the illustrated embodiment the pillars 42 and bridges 52, 54 have rounded or chamfered corners to define substantially circular holes 59. Holes 59 can be used to accurately position and retain the compression mat 34 in the clamp compartment 36 as will be described in greater detail below with reference to a second embodiment electrical connector.

FIG. 10 illustrates an interior portion of the compression mat 34, with an interior pillar 42a located in row 48a and column 50a. Pillar 42a is between two pillars 42b, 42c in row 48a and between two pillars 42d, 42e in column 50a. Pillar 42a includes opposite sides 44b and 44c that face the row pillars 42b, 42c and opposite sides 44d, 44e that face the column pillars 42d, 42e. Bridges 52, 54 alternate along the row 48a so lower bridge 52c and upper bridge 54b extend from opposite sides 44c, 44b of pillar 42a to adjacent pillars 42c, 42b in row 48a. Bridges 52, 54 also alternate along the column 50a so lower bridge 52d and upper bridge 54e extend from opposite sides 44d, 44e of pillar 42a to adjacent pillars 42d, 42e in column 50a.

Because bridges 52, 54 alternate along both the rows and columns, the set of lower bridges 52 and set of upper bridges 54 form "staircase" arrangements that extend across the width and length of the mat 34. Stair steps 60 represent one staircase arrangement of the upper bridges 54. The staircase arrangement is created by having each interior pillar 42 have lower bridges 52 extending from two adjacent sides 44 of the pillar 42 and upper bridges 54 extending from the other two adjacent sides 44 of the pillar.

Pillars 42 on the outer perimeter of the compression mat 34 are additionally interconnected by a set of perimeter bridges 64 (see FIG. 9). Each perimeter bridge 64 is a planar member located between bridge planes 56, 58. Perimeter bridge members 64 are integrally formed with the lower and upper bridge members 52, 54 extending between the pairs of outer pillars 42. The perimeter bridges 64 form a continuous reinforcement ring or strengthening ring 66 (see FIGS. 6 and 7) around the outer perimeter of the compression mat 34.

When compression mat 34 is compressed between clamp 18 and the flexible circuit substrate 28, each pillar 42 compresses longitudinally and applies a spring force to the overlying electrical contact 26, pressing the electrical contact 26 against the corresponding circuit board electrical contact. The rectangular cross section of the pillars 42 provides a relatively large cross-sectional area that enables each pillar 42 to generate a relatively high spring force, ensuring that reliable electrical connections between electrical contacts are made.

Pillars 42 bulge outwardly as they are compressed. The concave sides 44 of the pillars lose concavity as the pillars 42 bulge outwardly. The sides 44 of the pillars 42 will become convex before the facing sides 44 of adjacent pillars 42 contact one another. The initially concave sides 44 of the unstressed pillars 42 delay the onset and formation of convex pillar sides as the pillars 42 are compressed so that adjacent pillars 42 do not contact and interfere with one another although they are closely spaced.

The connecting bridges 52, 54 between the pillars 42 also compress and bulge outwardly as the pillars 42 are compressed. The concave sides 44 of the pillars 42 provide additional space for the bridges 52, 54 to bulge without the bridges 52, 54 interfering with the pillars 42. Furthermore, bridges 52 and 54 are located in spaced-apart planes 56, 58 and alternate along the rows and columns 48, 50 of pillars 42. As a result, bulging of each bridge 52 and 54 is effectively localized between pairs of adjacent pillars 42 and is not transmitted outwardly to the pillars 42 on the outer perimeter of the compression mat 34. The forces urging outer pillars 42 to buckle are minimized and so spring 34 generates a reliable spring force urging the electrical contacts together.

Compression mat 34 is preferably formed as an integral, one-piece member by injection molding. Strengthening ring 66 helps maintain the integrity of the molded piece as it is ejected from the mold.

FIGS. 11-14 illustrate a portion of a second embodiment electrical connector 110 in accordance with the present invention. Electrical connector 110 is similar to electrical connector 10 and includes a flexible circuit (not shown), a compression mat 112 identical to the compression mat 34, and a clamp 114 similar to the clamp 18. Compression mat 112 is shown in the figures as having only twenty columns of pillars for clarity. The same reference numbers used in describing clamp 18 and compression mat 34 will refer to the corresponding features of compression mat 112 and clamp 114.

Clamp 114 includes a number of alignment posts or pins 116 that extend from the floor 118 of the recess or compartment 36. The posts 116 help accurately position the compression mat 112 in the compartment 36 during installation of the mat in the clamp. The posts 116 are arranged in rows 120 and columns 122. As shown in FIGS. 13-15, posts 116 are received in respective holes 59 of the compression mat 112 when the mat 112 is installed in compartment 36.

Alignment posts 116 also assist in maintaining accurate position of the compression mat 112 in compartment 36 after installation. Each post 116 extends slightly above the lower bridges 52 when the compression mat 112 is in the compartment 36. The diameter of the posts 116 is sized so that each post 116 is immediately adjacent an adjoining lower bridge 52. Friction between the posts 116 and lower bridges 52 resist lateral movement of the compression mat 112.

It is not necessary that the clamp 114 have as many posts 116 as there are mat holes 59. Preferably the posts 116 are spaced apart in the rows and columns a distance 124, 126 respectively that is equal to an odd multiple of the row or column spacing of the mat holes 59. In the illustrated embodiment the row and column spacing of the posts 116 is equal to three times the row and column spacing of the mat holes 59. This places lower bridges 52 adjacent alternate sides of the posts 116 along the post rows 120 and columns 122. See FIGS. 13 and 14. In this way, the set of posts 116 resist lateral movement of the compression mat 112 regardless of the direction of such movement.

Other electrical connectors having different clamping structures for clamping a clamp against a circuit board are known and can be readily adapted for use with the present invention. Other electrical connectors that use a compression mat or pressure pad to apply spring force to individual contacts are known and can be readily adapted to use the compression mat 34 of the present invention.

My co-pending U.S. patent application Ser. Nos. 11/751,068 and 11/751,078, each titled "Flexible Circuit Connector Assembly", and each incorporated by reference as if fully set forth herein, disclose an electrical connector assembly that incorporates the compression mat 34 of the present invention.

My co-pending U.S. patent application Ser. No. 11/751,070 titled "Flexible Circuit Assembly with Strain Relief" incorporated by reference as if fully set forth herein, discloses yet another electrical connector assembly that can incorporate the compression mat 34 of the present invention.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention is:

1. A connector for providing electrical connections to a contact field on a circuit board, the connector comprising:
   a substrate, a compression mat, and a clamp;
   the substrate comprising a first side, a second side, and a contact field on the first side, the substrate contact field to be aligned with the contact field of the circuit board, the compression mat on the second side of the substrate, the clamp for compressing the compression mat against the substrate to form electrical connections between the contact fields when the contact fields are aligned;
   the compression mat comprising a plurality of pillars interconnected by a plurality of first bridges and second bridges, the pillars spaced from one another and arranged in a plurality of rows and columns, each pillar extending longitudinally between spaced apart ends, the plurality of first bridges spaced longitudinally from the plurality of second bridges; and
   each pair of adjacent pillars in a row or column interconnected by a single first bridge or a single second bridge whereby the plurality of first bridges interconnect some, but not all, of the pairs of pillars and the plurality of second bridges interconnect some, but not all, of the pairs of pillars.

2. The connector of claim 1 wherein the pillars comprise a plurality of interior pillars, each interior pillar between a first row pillar and a second row pillar in a common row and between a first column pillar and a second column pillar in a common column; and
   a pair of first bridges interconnect the interior pillar with one of the adjacent row pillars and one of the adjacent column pillars, a pair of second bridges interconnect the interior pillar with the other of the adjacent row pillars and the other of the adjacent column pillars.

3. The connector of claim 1 wherein the first and second bridges alternate along each row and column of pillars.

4. The connector of claim 1 wherein the first and second bridges are generally planar members.

5. The connector of claim 1 wherein the first bridges are co-planar in a first plane and the second bridges are co-planar in a second plane spaced from the first plane.

6. The connector of claim 1 wherein the first and second bridges are each arranged in a staircase arrangement.

7. The connector of claim 1 wherein each pillar of the compression mat has a cross section having at least one concave side when the compression mat is unstressed.

8. The connector of claim 7 wherein each pillar of the compression mat bulges out and at least partially fills the at least one concave side of the pillar cross section when the compression mat is compressed between the clamp and the substrate.

9. The connector of claim 1 wherein each pillar of the compression mat has a generally rectangular cross section when the compression mat is uncompressed.

10. The connector of claim 9 wherein the generally rectangular cross section of each pillar has concave sides.

11. The connector of claim 1 wherein the compression mat comprises a strengthening ring joining pillars located along the outer perimeter of the mat.

12. The connector of claim 1 wherein the first bridges and the second bridges are spaced inwardly from the pillar ends.

13. The connector of claim 1 wherein the contact field of the substrate comprises a plurality of contacts and each pillar of the compression mat overlies a respective one of said plurality of contacts.

14. The connector of claim 1 wherein each interior pillar of the compression mat comprises a first side, a second side, a third side, and a fourth side extending between the ends of the along the length of pillar, two first bridges extending from the first and second sides, two second bridges extending from the third and fourth sides.

15. The connector of claim 14 wherein for each interior pillar of the compression mat the first and second sides are adjacent one another and the third and fourth sides are adjacent to one another.

16. The connector of claim 1 wherein the clamp comprises a plurality of alignment posts and the compression mat comprises a plurality of passages, each post received in a respective passage.

17. A connector for providing electrical connections to a contact field on a circuit board, the connector comprising:
   a substrate, a compression mat, and a clamp;
   the substrate comprising a first side, a second side, and a contact field on the first side, the substrate contact field to be aligned with the contact field of the circuit board, the compression mat on the second side of the substrate, the clamp for compressing the compression mat against the substrate to form electrical connections between the contact fields when the contact fields are aligned;
   the compression mat comprising a plurality of fingers facing the substrate, each finger having a cross section comprising at least one concave side when the compression mat is unstressed.

18. The connector of claim 17 wherein each finger of the compression mat has a generally polygonal cross section having a plurality of concave sides.

19. The connector of claim 18 wherein each finger of the compression mat has a generally rectangular cross section.

20. The connector of claim 17 wherein each finger of the compression mat bulges out and at least partially fills the at least one concave side of the pillar cross section when compressed.

21. The connector of claim 17 wherein the compression mat is an integral, one-piece elastomeric member.

* * * * *